United States Patent [19]
Marshall et al.

[11] Patent Number: 5,793,245
[45] Date of Patent: Aug. 11, 1998

[54] WIDE RANGE GATE-SOURCE CLAMP

[75] Inventors: Andrew Marshall; Joseph A. Devore, both of Dallas; Raymond T. Summerlin, Parker, all of Tex.

[73] Assignee: Texas Instruments Incorporated, Dallas, Tex.

[21] Appl. No.: 731,629

[22] Filed: Oct. 15, 1996

[51] Int. Cl.⁶ .................................................. H03K 17/16
[52] U.S. Cl. ...................... 327/389; 327/321; 327/324; 327/329; 327/384; 326/27
[58] Field of Search .................. 327/108–112, 309–313, 327/315, 318, 319, 321, 327, 328, 331, 324, 329, 379, 384, 389; 326/85, 87, 27

[56] References Cited

U.S. PATENT DOCUMENTS

| | | | |
|---|---|---|---|
| 4,928,023 | 5/1990 | Marshall | 326/87 |
| 5,332,932 | 7/1994 | Runaldue | 326/33 |
| 5,627,487 | 5/1997 | Keeth | 326/87 |

*Primary Examiner*—Kenneth B. Wells
*Attorney, Agent, or Firm*—Christopher L. Maginniss; Wade James Brady, III; Richard L. Donaldson

[57] ABSTRACT

A switch mode regulator circuit is provided to facilitate the conversion from one voltage level to another in a substantially power lossless manner. The circuit is particularly advantageous in instances where the power supply can be operable in a discontinuous mode, as inductor-capacitor oscillatory transients ("ringing"), along with its associated voltage spikes at the associated output transistor source, can be avoided. Such transients and their associated voltages are avoided by clamping the gate-source voltage on the circuit's output NMOS transistor over the entire positive operation voltage range.

4 Claims, 3 Drawing Sheets

5,793,245

1

WIDE RANGE GATE-SOURCE CLAMP

TECHNICAL FIELD OF THE INVENTION

The invention relates generally to electronic circuitry, and more particularly to circuitry for clamping gate to source of MOS transistors.

BACKGROUND OF THE INVENTION

For many applications, it is desirable, when converting a voltage from one level to another, to do so in a manner that is substantially power lossless. One popular way to accomplish this objective is to utilize a switch mode regulator circuit as an interface between a voltage supply and device to be driven, such as a motor. Switch mode regulators can be used, for example, in personal computer power supplies, where an AC voltage is stepped down from line voltage to computer operating voltage, typically on the order of about 5 volts or less, depending upon the type of computer. Other uses for switch mode regulators relate to the control of motors such as computer printer motors that are provided in printers such as ink jet printers. In such instances, the printer motors, such as paper transport and carriage or ink jet transport motors, need to be controlled and coordinated in a precise manner to ensure optimal printer performance and coordination of the respective printing and paper transport functions.

Switch mode power supplies can operate in a discontinuous or continuous mode. In instances where the power supply never operates in a discontinuous mode, clamping the gate and source of the output transistor to ground is acceptable. However, if the power supply can operate in a discontinuous mode, voltage can occur on the source pin as a result of inductor-capacitor oscillatory transients, known also as "ringing". This "ringing" can cause tens of volts to appear on the output transistor source. As power discrete MOSFETs typically run only about 20V gate-source voltages, loads in excess of 20V can damage the gate of the MOSFET output driver.

While use of the ground clamped gate option of a gate-source voltage clamp can be used to limit the gate-source voltage on the output NMOS, this can pull the current to ground through the clamp, which can be undesirable. In the case of printer and computer system operation, such current draws are clearly undesirable. Accordingly, it would be desirable to provide a circuit which clamps the output transistor gate to the source, over an entire positive voltage range, without pulling a DC current, and while also maintaining all gate-source voltages within their specified voltage range limits.

BRIEF DESCRIPTION OF THE DRAWINGS

Embodiments of the invention have been chosen for purposes of illustration and description, and are shown with reference to the accompanying drawings, wherein.

2

SUMMARY OF THE INVENTION

A switch mode regulator circuit is provided to facilitate the conversion from one voltage level to another in a substantially power lossless manner. The circuit is particularly advantageous in instances where the power supply can be operable in a discontinuous mode, as inductor-capacitor oscillatory transients ("ringing"), along with its associated voltage spikes at the associated output transistor source, can be avoided. Such transients and their associated voltages are avoided by clamping the gate-source voltage on the circuit's output NMOS transistor over the entire positive operation voltage range.

In the circuit of the present invention a logic level input is converted by an associated pre-drive circuit to drive "high" and "low" voltage off-drive circuitry and on-drive circuitry to the output switch serving as a switching transistor for the switch mode power supply. The "high" and "low" voltage off-drive circuits are operable to force the output switch into an "off" state to render wide-range gate-source clamping of the output transistor.

Two voltage clamps are provided in the circuit and are operable to control the gate-source of the output transistor in accordance with the voltage level of a logic input signal to the circuit. One clamp is located within the low voltage "off" drive whereas the other clamp is located within the high voltage "off" drive. Threshold voltages can be selected for each of the voltage clamps to modify performance characteristics of the switch mode regulator. In a preferred aspect of the invention, an input voltage in excess of about 19V activates the high voltage "off" drive clamp, clamping the gate to source of the output transistor to render an "off" state. A voltage input between about 15V–19V activates both clamps. When the input is switched to a logic level low, both clamps are deactivated, thereby allowing for the output transistor to be turned "on".

Two alternative circuit embodiments are provided. One embodiment (FIG. 3) optimizes control of "off" state current flow, at the nominal expense of die area. The other embodiment (FIG. 5) optimizes die area, but exhibits a small off-state current flow, which is usually insignificant in comparison to the inductor current flow of external circuitry with which the switch mode regulator is associated.

DETAILED DESCRIPTION OF THE PREFERRED EMBODIMENTS

Figure 1:
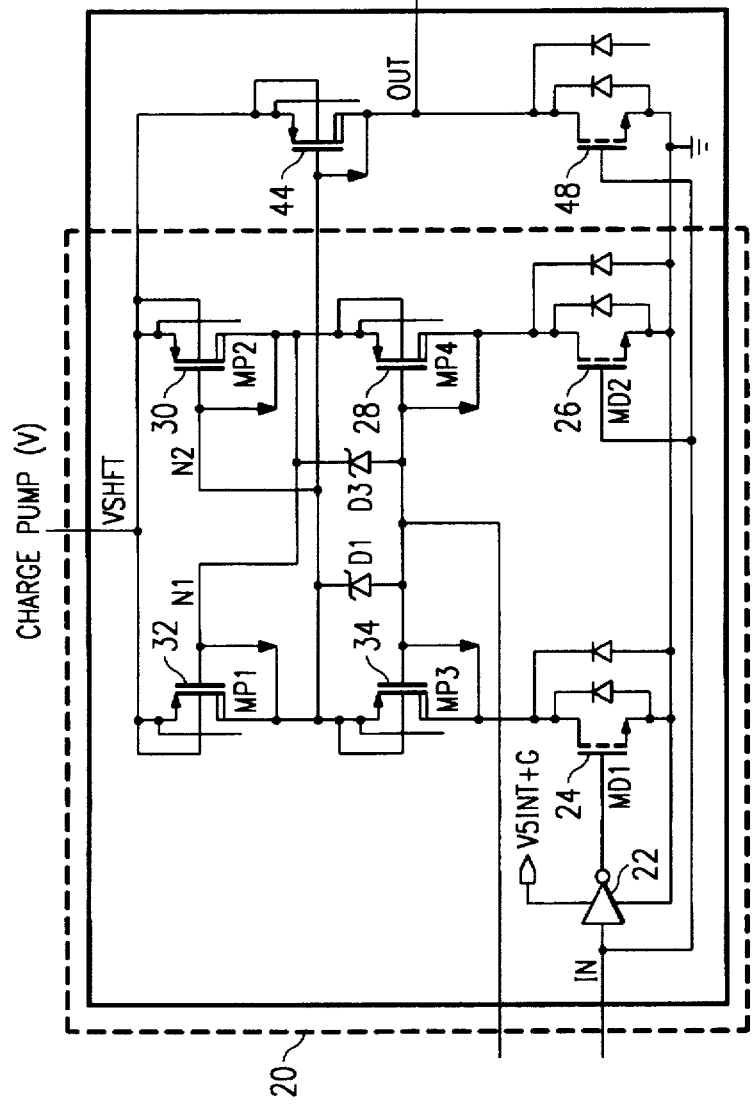
FIG. 1 is a schematic diagram of a conventional switch mode regulator output circuit.

With reference to the drawings, wherein like reference characters represent corresponding parts throughout the various views, and with particular reference to FIG. 1, there is illustrated the output stage of a conventional switch mode regulator circuit. The output stage includes a pre-drive or level shift 20 that is comprised of an inverter 22 and a parallel array of transistors 24, 26, 28, 30, 32 and 34. Transistors 24 and 26 are NMOS transistors, whereas transistors 28, 30, 32 and 34 are PMOS transistors. The gates of PMOS transistors 28 and 34 are shorted to a reference voltage, as shown in the drawing.

The pre-drive or level shift 20 is provided to switch the output transistor 40 between "on" and "off" conditions. Switching is accomplished through the operation of an "on" drive transistor 44 and an "off" drive transistor 48. An inductor-capacitor circuit 54, such as a Buck regulator 54, is connected between the output transistor 40 and the output node 56 and is operable to regulate current flow between the transistor 40 and the output node 56. The output transistor 40 is typically configured as an external FET, as it consumes considerable power. The drive transistors 44 & 48 are operable in conjunction with the level shift 20 to maintain the output transistor 40 in its linear region.

Figure 2:
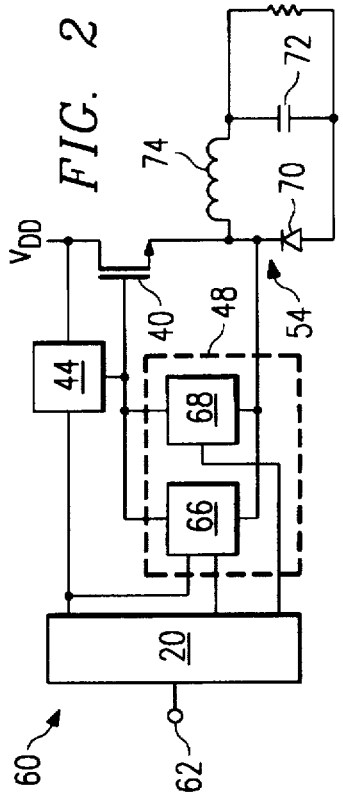
FIG. 2 is a block diagram of a wide range gate-source clamp in accordance with the present invention.

FIG. 2 is a block diagram of a wide range gate-source clamp 60 in accordance with the present invention. The logic level input 62 is converted by a pre-drive circuit 20 to drive on-drive circuitry 44, high voltage off-drive circuitry 66 & low voltage 68 off-drive circuitry (collectively represented by block 48), to an output switching transistor 40 for the switch-mode power supply output circuit. Output from the high and low voltage drives 66 & 68, respectively, is directed to the source of the output transistor 40 through an inductor-capacitor bandpass filter in the form of a Buck regulator, indicated generally at 54, as discussed previously. The bandpass filter includes a diode 70 that is coupled to a capacitor 72. Output from the capacitor 72 is directed through an inductor coil 74 prior to the delivery to the output switch 40 to regulate voltage supplied to the output switches within prescribed levels typically zero to 40 V. The foregoing circuit is operable to actively clamp across the entire positive range of gate-source operation so as not to exceed a gate-source voltage maximum and not pull current from the inductor-capacitor circuit 54.

Figure 3:
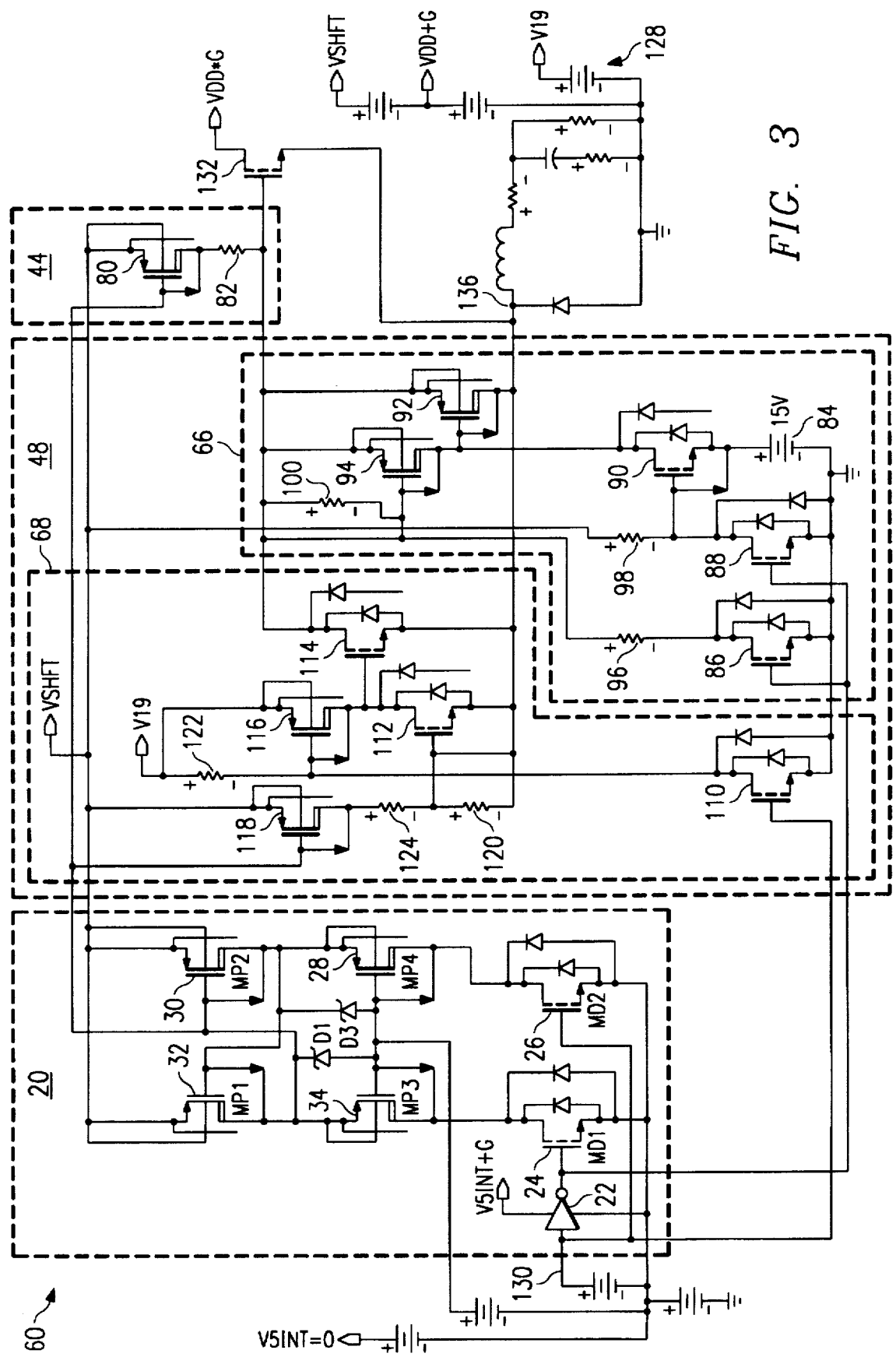
FIG. 3 is a schematic diagram of a switch mode regulator circuit in accordance with the present invention.

Further aspects of the gate-source clamp 60 illustrated in FIG. 2 are depicted in FIG. 3. The circuit pre-drive 20 comprises inverter 22 and a parallel array of transistors 24, 26, 28, 30, 32 and 34. Transistors 28–34 are PMOS transistors that are arranged in a parallel configuration such that the gates of transistors 28 and 34 are coupled to one another and shorted to a reference voltage, which is typically about 14–20V less than the typical $V_{ship}$ value of about 34–35V. Transistors 24 and 26 are NMOS transistors. When transistor 26 is turned "on", it pulls the gate of transistor 28 low. However, the voltage pull on the gate is restricted to the value of $V_{ref}$ since as $V_{source}$ approaches $V_{gate}$, transistor 28 shuts "off". As a result, the full gate voltage swing that would otherwise be available on transistor 28 is not experienced, thereby preventing gate-source damage.

The "on" drive 44 is comprised of PMOS transistor 80 and resistor 82. The transistor 80 is connected to the pre-drive 20 through PMOS transistors 28, 30, 32 and 34. As has been noted previously, the "off" drive 48 is comprised of high voltage 66 and low voltage 68 components. The high voltage component 66 is comprised of voltage source 84, NMOS transistors 86, 88 and 90 that are serially connected to the voltage source 84, and to the PMOS transistors 92 and 94. Resistors 96 and 98 are respectively coupled to transistors 86 and 88. Transistor 100 is connected to PMOS transistor 94. The "off" drive low voltage component 68 is comprised of NMOS transistors 110, 111 & 114, and PMOS transistors 116 and 118. Resistors 120, 122 & 124 are respectively associated with transistors 112, 114 & 118. A reference supply voltage 128 powers the low voltage component 68. In a preferred aspect of the invention, the low voltage component 128 is a 19 volt reference, whereas high voltage reference 84 is a 15 volt reference. Input 130 serves as a logic level switch input that determines whether output switching transistor 132 is "on" or "off". In instances where the logic level input 130 is high, low voltage transistor 110 is "on", and high voltage transistors 86 and 88 are "off" which, in turn, turns "on" high voltage transistors 90 & 92 and low voltage transistors 114 & 116. High voltage transistor 94 and "on" drive transistor 80 are in an "off" state. Operation of the transistors in the foregoing manner serves to clamp the output switch transistor 132 gate to source and defines the transistor "off" state.

In instances where the voltage at node 136 is less than 15 volts, the gate-source clamp that is "active" is the "off" drive low voltage transistor 114. When the voltage exceeds 19 volts, the "off" drive high voltage transistor 92 serves as the "active" transistor, with a transition between 15 and 19 volts being where both gate-source clamps provided by the foregoing transistors 92 and 114 are "active." The transistors 92 & 114 are sized so that either transistor 92 or transistor 114 is individually capable of maintaining effective clamping. During clamping, virtually no DC current flows from node 136 to either $V_{dd}$ supply or ground. In instances where input 130 is switched to a logic level "low", transistors 92 & 114 are turned "off", and "on" drive transistor 80 is turned "on", thereby turning "on" output switching transistor 132.

Figure 4:
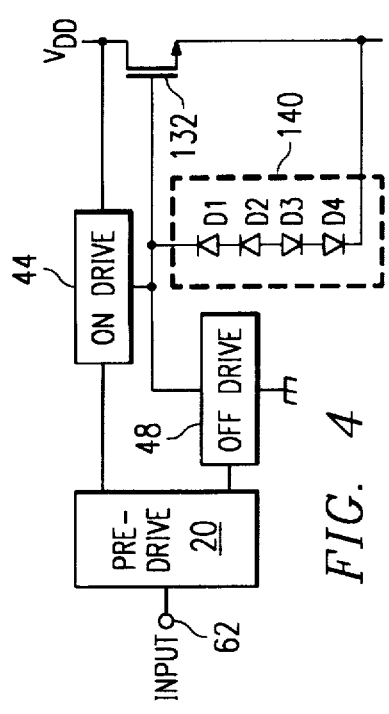
FIG. 4 is block diagram of an alternative wide range gate-source clamp in accordance wits the present invention.

With reference to FIG. 4, there is depicted a block diagram for an alternative circuit embodiment of the present invention. As with the foregoing embodiment, a logic input 62 is converted by a pre-drive unit 20 to drive "high" and "low" voltage (not shown) "off" -drive circuitry 48 and "on" -drive circuitry 44 to the output switch 132 used as a switching transistor for the switch-mode power output circuit. A diode array 140 is interposed between the "off" -drive 48 & "on" -drive 44 and the gate of the output transistor 132. As will be described below, the diode assembly serves as a gate-source clamp for the output switch 132.

Figure 5:
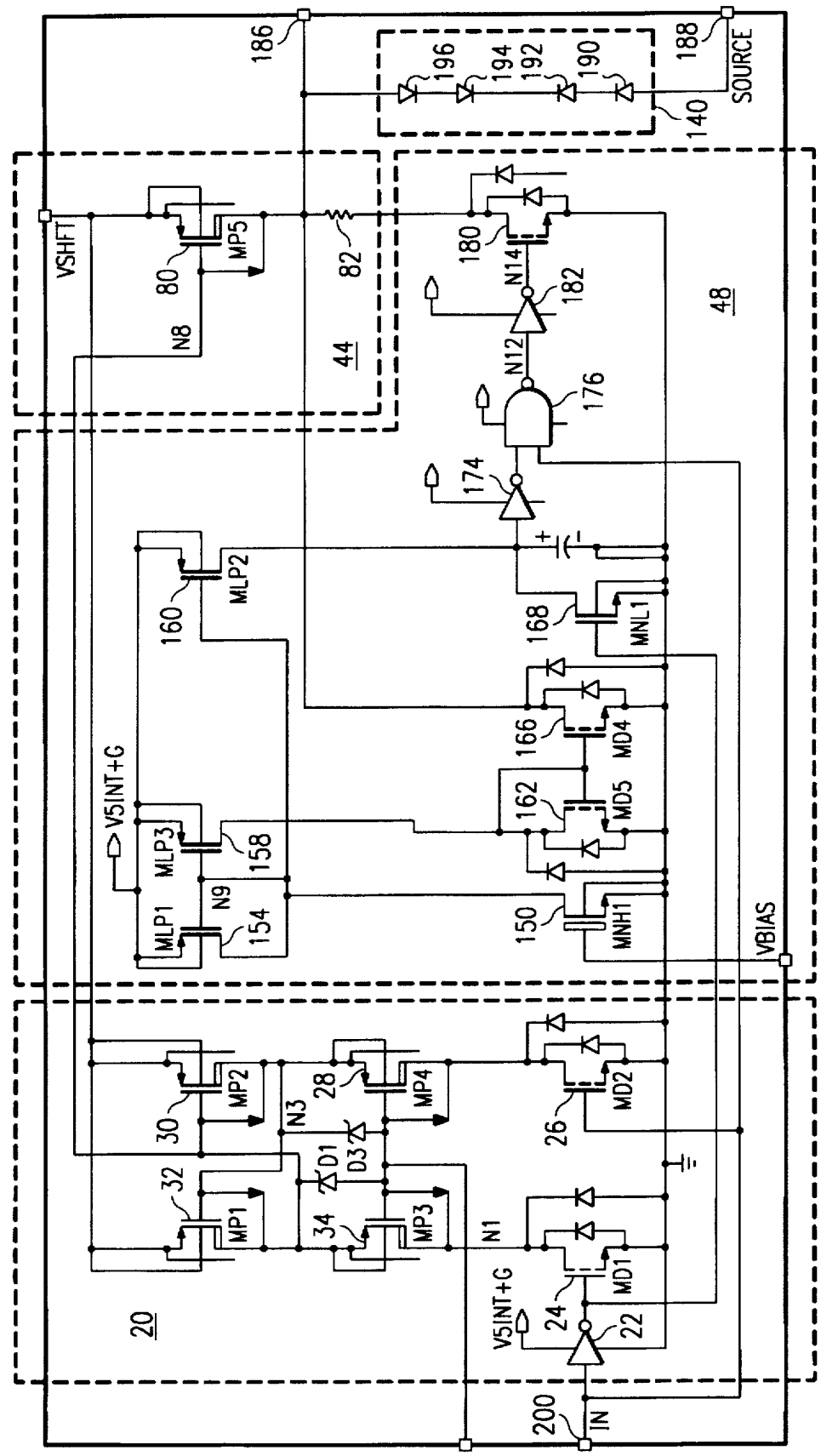
FIG. 5 is a schematic diagram of the circuit illustrated in FIG. 4.

With concurrent reference to FIGS. 4 and 5, the circuit pre-drive 20 is comprised of the same transistor and diode array as that described previously with respect to the embodiment depicted in FIG. 3. The circuit "on" -drive 44 is comprised of PMOS transistor 80 and resistor 82, as described previously.

The principal differences between the embodiments depicted in FIGS. 3 and 5 relate to the structure of the "off" drive 48. The "off" -drive 48 is comprised of NMOS transistor 150, back-gate connected PMOS transistor pair 154 & 158, PMOS transistor 160, back-gate connected NMOS transistor pair 162 & 166, and NMOS transistor 168. The drains of transistors 160 and 168 are connected to capacitor 170 and inverter 174. Output from the inverter 174 is directed to NAND gate 176, the output of which, in turn, is directed to NMOS transistor 180 through inverter 182. The drain of NMOS transistor 180 is connected to the drain of on-drive transistor 80 through resistor 82. As was mentioned previously, a gate-source clamp in the form of a diode array 140 is provided between the gate 186 and source 188 of the output switching transistor (not shown) and is comprised of a serial array of diodes 190, 192, 194 & 196.

With further reference to FIGS. 4 and 5, input at node 200 serves as the logic level switch input which defines whether the output switching transistor 132 is in an "on" or "off" state. In instances where the input at node 200 is "high" NAND gate 176 is enabled, and NMOS transistor 26 is "on", output from the on-drive transistor 80 is turned "off". When transistor 168 is turned "off", its drain voltage gradually rises due to charging of capacitor 170, during which time NMOS transistor 180 is temporarily turned "on". Activation of transistor 180 turns "off" the output transistor gate 186, pulling the gate "low" at a fast rate. Once this initial transient has been completed, a controlled and small current of approximately 200µ amps is pulled from the gate 186 to the ground. In instances where the input at node 200 is switched to logic level "low," the on-drive transistor 80 is turned "on" while the "off" -drive transistor is 180 is turn off.

The foregoing embodiments each have unique advantages. For example, the embodiment depicted in FIG. 3 is advantageous in instances where die area is not a critical design constraint, as this embodiment features a virtually non-existent "off" state current flow through the output transistor 132. In contrast, the embodiment depicted in FIG. 5 exhibits an appreciably reduced die footprint, but allows for a modest "off" state current through the output transistor. This "off" state current is typically insignificant in comparison to the inductor current of associated external circuitry. As such, the circuit design of FIG. 5 is believed to be suitable for the majority of commercial implementations.

Those skilled in the art to which the invention relates will appreciate that other substitutions and modifications can be made to the described embodiment, without departing from the spirit and scope of the invention as defined by the claims below.

What is claimed is:

1. An electrical circuit operable to convert a voltage within a prescribed voltage level comprising:

a pre-drive circuit;

an on drive circuit connected to said pre-drive circuit;

an output transistor connected to said on drive circuit;

a high voltage off drive circuit connected to said pre-drive circuit and to said output transistor;

a low voltage off drive circuit connected to said pre-drive circuit and to said output transistor; and a current regulator circuit connected to said high voltage and low voltage off drive circuits, respectively, wherein said current regulator circuit comprises an inductor-capacitor filter circuit.

2. The circuit according to claim 1, wherein said inductor-capacitor circuit comprises a diode coupled to a capacitor, said capacitor being connected to an inductor coil interposed between said capacitor and said output transistor.

3. The circuit according to claim 1, wherein said low voltage "off" drive circuit comprises a parallel array of at least one p-type transistor and at least one n-type transistor connected to said pre-drive circuit.

4. The circuit according to claim 3, further comprising a semiconductor switching device connected to at least one of said p-type and n-type transistors and to said output transistor.

* * * * *